United States Patent [19]

Braymen

[11] Patent Number: 5,348,617
[45] Date of Patent: Sep. 20, 1994

[54] SELECTIVE ETCHING PROCESS

[75] Inventor: Steve D. Braymen, Ames, Iowa

[73] Assignee: Iowa State University Research Foundation, Inc., Ames, Iowa

[21] Appl. No.: 813,152

[22] Filed: Dec. 23, 1991

[51] Int. Cl.$^5$ .......................................... H01L 21/00
[52] U.S. Cl. .................... 156/644; 156/656; 156/657; 156/662; 252/79.1; 437/225; 437/228
[58] Field of Search ............... 156/656, 657, 662, 644, 156/647; 252/79.1; 437/228, 225

[56] References Cited

U.S. PATENT DOCUMENTS

| | | | |
|---|---|---|---|
| 3,160,539 | 12/1964 | Hall et al. | 156/17 |
| 3,649,395 | 3/1972 | Lee | 156/16 |
| 3,966,517 | 6/1976 | Claes et al. | 156/662 |
| 4,026,733 | 5/1977 | Owen, III et al. | 156/662 X |
| 4,137,123 | 1/1979 | Bailey et al. | 156/662 X |
| 4,155,866 | 5/1979 | Berkenblit et al. | 252/79 |
| 4,389,429 | 6/1983 | Soclof | 156/656 X |
| 4,502,932 | 3/1985 | Kline et al. | 204/192 |
| 4,513,348 | 4/1985 | Grantham | 361/283 |
| 4,851,080 | 7/1989 | Howe et al. | 156/647 |
| 5,075,641 | 12/1991 | Weber et al. | 204/192.18 X |

FOREIGN PATENT DOCUMENTS 0715609 2/1980 U.S.S.R.
938202 3/1962 United Kingdom.

OTHER PUBLICATIONS

Progress In The Development Of Miniature Thin Film Baw Resonator and Filter Technology by T. W. Grudkowski et al., 36th Annual Frequency Control Symposium, pp. 537-548 (1982).

Thin Film Resonators and Filters by K. M. Lakin et al., 1982 Ultrasonics Symposium, pp. 466-475.

*The Merck Index*, "An Encyclopedia of Chemical, Drugs, and Biologicals", Tenth Edition, pp. 706, 707, 1167, 7998 (1983).

*Hackh's Chemical Dictionary*, Fourth Edition, pp. 208, 330, 335, 336, 565, 566, 1972.

Primary Examiner—Thi Dang
Attorney, Agent, or Firm—Leydig, Voit & Meyer, Ltd.

[57] ABSTRACT

A process for selectively etching silicon comprises preparing a solution of etchant which is a non-selective etch for at least silicon and aluminum. The prepared solution is preconditioned by adding atomic silicon to the solution and aging the solution after the addition of silicon for at least 30 minutes. Then, silicon substrates carrying aluminum are immersed in the preconditioned solution to etch the silicon while leaving the aluminum substantially unaffected.

15 Claims, 3 Drawing Sheets

SELECTIVE ETCHING PROCESS

FIELD OF THE INVENTION

This invention relates to fabricating thin film resonators on silicon wafers, more particularly to an etching process useful in such fabrication, and more broadly to a selective etching process useful for forming electronic devices on silicon.

BACKGROUND OF THE INVENTION

Thin film resonator, or TFR, technology, has received much interest over the last several years. The thin film resonator technology makes possible a class of thin film microwave acoustic devices that are truly compatible with active semiconductor circuitry. The small size of the thin film resonator is compatible with semiconductor technology, and the thin film resonator can be integrated with semiconductor devices onto a common substrate.

To operate in the fundamental mode at VHF to microwave frequency ranges, a resonator must have a thickness in the range of tens of microns to less than one micron. Devices of such thicknesses are very fragile and easily damaged, and require some form of external support during and after manufacture for any practical application. This requirement has given rise to the development of etching techniques which provide for the placing of the device on a silicon substrate, with a cavity etched into the silicon underneath the device to allow free movement of the device. This permits the edges of the device to be supported by the silicon substrate.

The basic thin film resonator technology uses DC magnetron sputtered highly-oriented thin films of dielectric material, preferably aluminum nitride (AlN) or zinc oxide (ZnO). The dielectric film is sandwiched between a pair of conductive electrodes, typically thin film aluminum electrodes, and the electrodes serve not only as electrical interconnections, but also acoustic reflecting surfaces for guiding and trapping the acoustic energy in the dielectric thin film. The acoustic cavity for the resonator is defined by the aluminum-silicon composite membrane structure. That membrane should be of low mass for high frequency operation, and that, in turn usually requires the removal of substrate material underlying the membrane portion of the thin film resonator. It has been typical to accomplish that by first forming a highly doped p+ region near the top surface of the semiconductor substrate, then etching a via from the bottom surface terminating at the p+ layer, which functions as an etchant stop. The thin film resonator is then formed on the p+ membrane. After formation of the thin film resonator, a selective etching process removes the p+ membrane, leaving the resonator suspended.

In this process of using a p+ membrane, several problems exist which contribute to the difficulty of manufacturing thin film resonators. For example, the p+ membranes are fragile and easily damaged. Moreover, the use of a p+ membrane causes misfit dislocations. These are inevitable with the diffusion of high dopant concentrations, and reduce the crystal integrity of the wafer surface for device manufacture.

Furthermore, the layers of the thin film resonator are themselves extremely thin and fragile. The requirement that the layers be deposited on a membrane which is itself extremely fragile, adds greatly to the difficulty and expense of manufacture and increases the likelihood of introducing manufacturing defects. Moreover, the creation of the p+ layer is costly and time consuming, requiring high-temperature equipment and long processing times.

Finally, the etchants used in the manufacturing process are extremely corrosive, especially to metals, and could not be permitted to come in contact with the thin film resonators. In the foregoing process, it was therefore necessary to remove the underlying substrate material with the etching step, and for the etching step to be completed prior to the deposition of the thin film resonator layers onto the substrate.

SUMMARY OF THE INVENTION

In view of the foregoing, it is a general object of the present invention to provide a process for constructing thin film resonators on silicon wafers which lessens the difficulty and expense of the manufacturing process, and which reduces the number of defects introduced in the manufacturing process.

In that respect, it is an object of the present invention to provide a process which allows the construction of a thin film resonator without the need for creation of a p+ layer.

It is a further object of the present invention to provide a process which allows the thin film resonator to be deposited on a substrate at a time when the substrate is relatively non-fragile.

It is still another object of the present invention to provide a process which allows the thin film resonator to be deposited before etching of the substrate takes place.

It is yet another object of the present invention to provide a process which allows etching of the substrate to take place in the presence of an electronic device, but without damaging the device.

Accordingly, it is a feature of the present invention to provide an etchant which is selective to silicon in the presence of aluminum.

It is another feature of the present invention that a thin film resonator can be created by a process which employs the etchant late in the manufacturing process, allowing the thin film resonator to be supported by the silicon substrate during manufacture.

It is an additional feature of the present invention that a thin film resonator can be exposed to the etchant without harming the thin film resonator.

It is still another feature of the present invention that an etchant which is non-selective is rendered selective by a preconditioning step interposed in the process flow, which renders the etchant useful at a point in the process where non-selectivity would render it unsuitable, thereby allowing the etching to take place late in the process.

It is yet another feature of the present invention to provide for the fabrication of any electronic device which includes a patterned aluminum layer on a silicon substrate, with the silicon substrate being etched without damage to the electronic device.

In accordance with one aspect of the present invention, a selective etchant for silicon is provided. The selective etchant comprises an aqueous solution of hydrazine and quinoxaline, and atomic silicon in the solution in a sufficient quantity to render the etchant selective to silicon.

In a related aspect of the present invention, a process for selectively etching silicon is provided. The process comprises preparing a solution of etchant which is a non-selective etch for at least silicon and aluminum. The prepared solution is preconditioned by adding atomic silicon to the solution and aging the solution after the addition of silicon for at least 30 minutes. Then, silicon substrates carrying aluminum are immersed in the preconditioned solution to etch the silicon while leaving the aluminum substantially unaffected.

In another related aspect of the present invention, a process for fabricating an electronic device on a silicon substrate is provided. The device has a patterned conductor and an aperture in the substrate underlying at least a part of the electronic device. The process comprises the steps of providing a silicon substrate, and forming the electronic device on the substrate. The forming step includes the step of depositing and patterning at least one aluminum pattern, with at least part of the aluminum pattern being exposed to an etchant in a subsequent etching step. Then, an aperture is etched in the semiconductor substrate to remove an area of the substrate, but without removal of the exposed aluminum pattern.

In accordance with yet another aspect of the present invention, a process for fabricating a thin film resonator is provided. The process includes the steps of providing a silicon substrate having first and second surfaces, and then depositing alternating metallization layers and piezoelectric layers on the first surface of the substrate, with the metallization layers being the first and last deposited layers. An aperture is then etched in the second surface of the semiconductor substrate to remove an area of the substrate from below the resonating portion of the thin film resonator. The step of etching comprises immersing the substrate in a selective etchant which is selective to silicon in the presence of the metallization or piezoelectric material of the resonator. Then, the etching step is terminated when the etching reaches the first deposited layer.

BRIEF DESCRIPTION OF THE DRAWINGS

Other objects and advantages will become apparent from the following detailed description when taken in conjunction with the drawings, in which.

DETAILED DESCRIPTION OF THE PREFERRED EMBODIMENTS

While the invention will be described in connection with preferred embodiments, there is no intent to limit the invention to those embodiments. On the contrary, the intent is to cover all alternatives, modifications, and equivalents included within the spirit and scope of the invention as defined in the appended claims.

Figure 1:
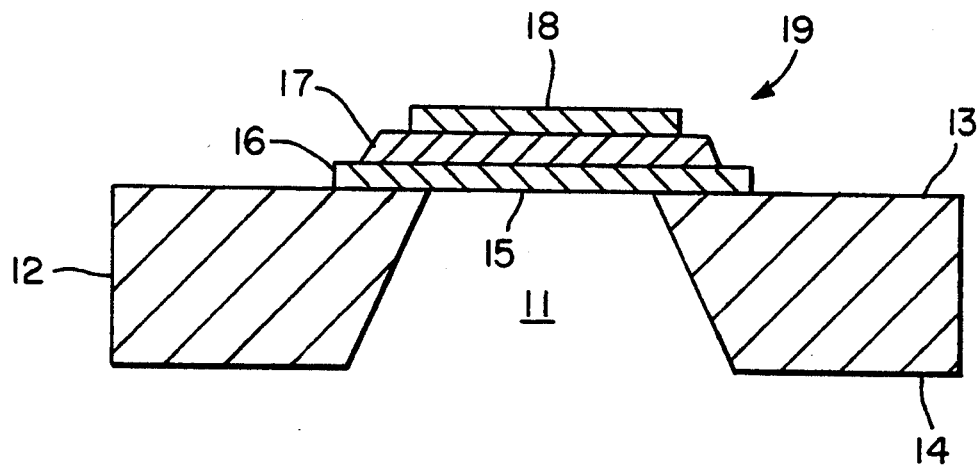
FIG. 1 is a diagram schematically illustrating a thin film resonator exemplifying the present invention.

Turning to the drawings, FIG. 1 shows a thin film resonator 19, in this instance a two terminal device. The device is based on a semiconductor substrate 14 which has upper 13 and lower 12 opposed surfaces, which are generally planar and parallel. A via 11 formed below the thin film resonator frees a membrane portion 15 for acoustic vibration so that the thin film resonator can operate in the fundamental mode.

Referring in greater detail to the thin film resonator 19, it can be seen that the device includes a lower metal electrode 16, and an upper metal electrode 18 sandwiching an intermediate thin film piezoelectric layer 17. The metal electrodes 16 and 18 as will be described in greater detail below, are typically thin film electrodes deposited as by sputtering or electron beam evaporation. It is important that the metallic layer forming metal electrode 16 be smooth, thin and continuous and provide a smooth surface for receiving a highly oriented thin film of piezoelectric material. The piezoelectric thin film layer 17 is deposited as by DC magnetron sputtering, following which the upper electrode 18 is deposited.

The thin film resonator is formed on the substrate at a time when the substrate is strong and capable of withstanding the various processes for formation of the foregoing elements. Having formed the thin film resonator, metallization for the contacts, and interconnections if desired, the partly formed device is then subjected to an etching step which removes all or at least a portion of the substrate materials from below the membrane portion of the thin film resonator. In accordance with the present invention, the etching step is adapted to selectively etch the pure silicon of the substrate, while being relatively nonreactive to the materials formed on the upper surface of the device, such as the metallization and the dielectric which are exposed on that upper surface. Thus, the process steps provide for a relatively non-fragile wafer during the numerous steps needed to deposit the dopant impurities, perform the lithographic steps, etching steps, sputtering steps and the like, then, late in the process, after the majority of the process steps are completed, etches away the necessary material to free the resonator, but accomplishes the etching step in such a way that the delicate and previously formed resonator is not damaged. The ability to accomplish that is particularly significant when one notes that the mass and size of the silicon which must be removed from below the resonator is orders of magnitude greater than the mass and size of the portions of the device which must be protected.

Figure 2:
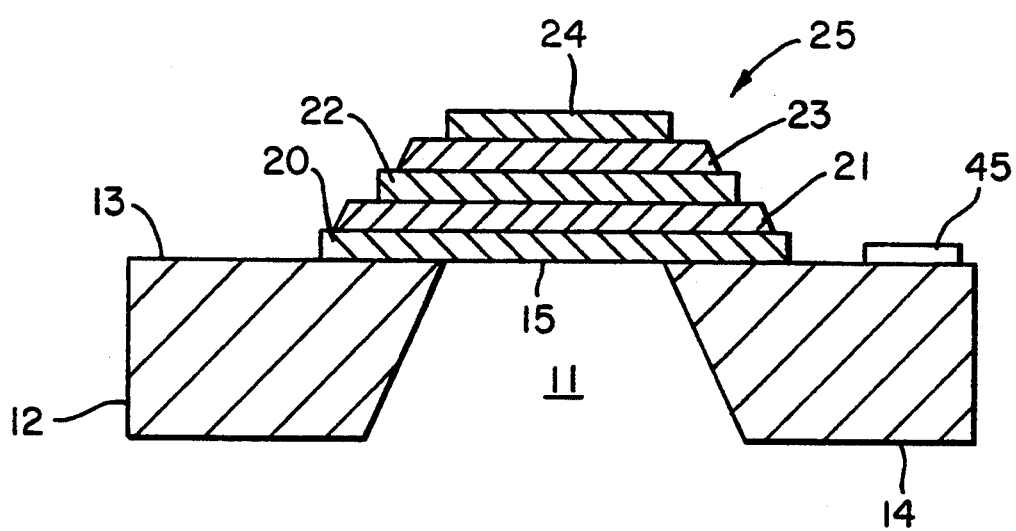
FIG. 2 is a diagram similar to FIG. 1 illustrating a stacked crystal filter, and showing an additional electronic device which can be created by a process similar to that employed to create the thin film resonator.

Turning to FIG. 2, there is shown a stacked crystal filter 25 employed as the thin film resonator, as well as an additional electronic device 45 on the upper surface 13 of the substrate 14. The stacked crystal filter includes a lower electrode 20 and a first piezoelectric thin film 21, an intermediate electrode 22, a second piezoelectric thin film 23, and an upper electrode 24. The piezoelectric films are typically about 5 microns thick in order to provide a resonator frequency response in the range of 1 GHz. The substrate is removed from beneath the central portion of the resonator, providing for free vibration of the resonator.

It is oftentimes desirable (although not easy to accomplish) to include electronic devices on the same substrate as the stacked crystal filter 25 of FIG. 2. For example, when it is desired to produce an integrated oscillator, both electronic components (transistors, etc.) and the resonator are desirably formed on the same substrate, and interconnected to produce an oscillator whose frequency is controlled by the stacked crystal filter. The process of the present invention is particularly amenable to formation of such devices because the electronic devices can be formed on the substrate prior to etching of the via which frees the membrane of the stacked crystal filter. In the FIG. 2 embodiment, the additional electronic devices are schematically represented at 45. The schematic representation encompasses electronic devices of various forms including those which would utilize ion implantation, diffusion, sputtering, other plating techniques, lithographic techniques, and the like, all commonly used in microelectronic fabrication for forming transistors, resistors, or other electronic devices. In accordance with the present invention, those processes can be performed on the semiconductor substrate prior to etching of the via 11. The etchant and etching process according to the present invention have been found to be selective to silicon in the presence of metallization and the like which are either normally present in or can be applied to electronic devices 45, so that the entire integrated device including stacked crystal filter and electronic components can be formed prior to accomplishing the etching step which produces the via 11 to complete the thin film resonator.

Figure 3:
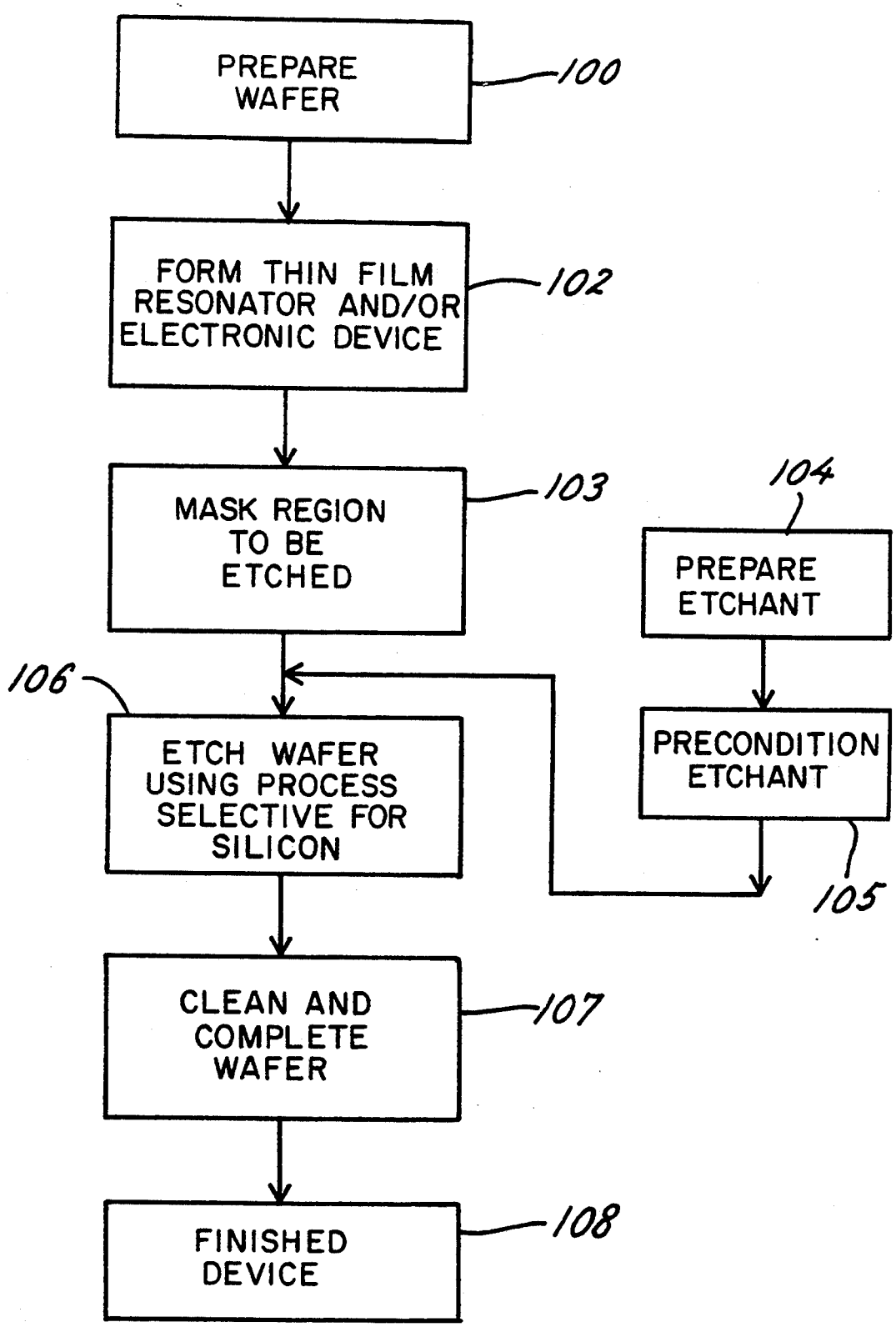
FIG. 3 is a block diagram illustrating the process steps employed in the present invention to produce thin film resonators.

Turning to FIG. 3, there is illustrated the sequence of the process steps which will be set out in more detail below. FIG. 3 also shows the parallel sequences of processes employed by the invention. The processes include the preparation of the wafer, the formation of the thin film resonator on the wafer, the masking of the region to be etched, the etching of the wafer, and the cleaning and completion of the wafer, yielding the finished device. In parallel with these process steps are the preparation of the etchant and the preconditioning of the etchant, the preconditioning of the etchant being completed before the etching. It will be apparent from an examination of FIG. 3 that the etching step is one of the last steps involved in manufacturing the thin film resonator. It will also be apparent that the preconditioning of the etchant is an important step in the manufacturing process.

In greater detail, the process flow includes a wafer preparation step 100 which includes all of the standard cleaning and other preparatory steps performed on the raw wafer. Step 102 is a broad step which encompasses all the necessary techniques for forming of the thin film resonator and/or other electronic devices. Of course, the process step 102 does not include the etching which actually frees the membrane, but it preferably includes all of the deposition steps which form the resonator, as well as all of the deposition steps which form the electronic device and the interconnections between such devices. Passivating and metallizing layers can also be formed in the step 102.

There may be situations where it is desirable to perform one or more of the substeps which form the overall process step 102 at a stage later than the etching step. That aspect can also be included within the invention, realizing, however, that it is most desirable to perform most of the fabrication steps prior to the final etching step, since the final etching step substantially increases the susceptibility to damage of the device.

Having performed the process steps 102, a step 103 is performed to mask the via in the region to be etched. In a parallel process, the etchant had been prepared in a step 104 and preconditioned in a step 105. The mixing and preconditioning steps will be described in greater detail below. Suffice it to say, however, at the end of process step 105 the etchant is preconditioned and is at an appropriate temperature so that when a partly fabricated device including thin film resonators (and electronic components if present) is immersed into the etchant, etching of the silicon will proceed while the etchant will be ineffective to attack the metallization.

A step 106 represents the etching process itself, and after etching is complete, a step 107 is utilized to clean and complete the wafer to yield a finished device represented at 108.

Turning now to FIGS. 4a–4f, there are illustrated a sequence of process steps and the state of formation of the device as it progresses from step to step beginning with a raw semiconductor substrate through the manufacture of a thin film resonator. It will be appreciated that the process steps relate to formation of a single thin film resonator, in the present instance a stacked crystal filter which is a two port device, and is representative of a broader range of thin film resonators. Thus, while the masking will differ for formation of different devices, the sequence of process steps will remain substantially the same.

Figure 4A:
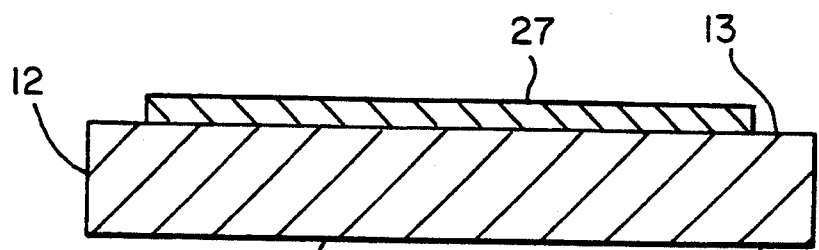
FIGS. 4a–4f sequentially illustrate the process steps for forming a thin film resonator exemplifying the present invention.

Sputter deposition using a DC magnetron is utilized to form the thin film resonator. Thus, in the exemplary process of FIG. 4, FIG. 4a illustrates the deposition of a first conductive layer or metallization layer 27 which, in that illustrated embodiment, serves as the lower electrode for the thin film resonator. Thus, it is seen that the layer 27 is deposited in a region 26 in which the thin film resonator will be formed. There is no need to pre-etch the wafer in region 26.

Having deposited the metallization layer 27, the metal is then covered with a photoresist, patterned and etched to form the metal layer into the desired pattern.

Figure 4B:
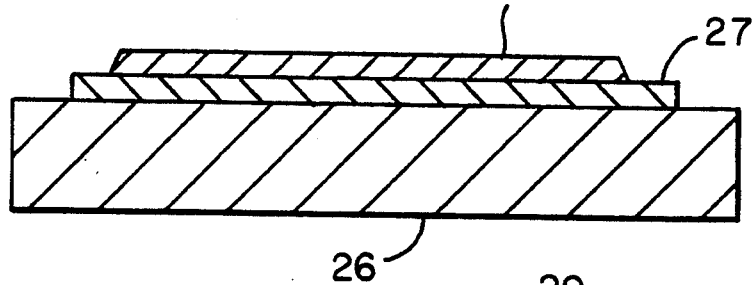

After the photoresist is stripped and the wafer cleaned of all residue (rinsed with acetone) from the device in the condition illustrated in FIG. 4a, the process proceeds to the stage illustrated in FIG. 4b which includes the formation of a thin film piezoelectric layer 28. The piezoelectric layer 28 is preferably of AlN deposited in an oriented film by DC magnetron sputtering. An available technique for patterning the AlN layer over the lower metallization 27 if desired is by sputtering through an aperture mask. However, in practicing the present invention, it is presently preferred to use a dielectric liftoff process for patterning of the AlN piezoelectric layer.

In utilizing the dielectric liftoff process, an initial layer, which will serve as a sacrificial layer in the dielectric liftoff process, is first deposited. It is currently preferred to utilize zinc oxide as the sacrificial layer and to deposit that material by sputter deposition using a DC magnetron. A zinc target is utilized in an oxygen plasma to deposit a ZnO layer, preferably about 5 microns in thickness, over the entire upper surface of the device. The zinc target is then removed and a silicon target put in its place to deposit about 1000 Å of silicon dioxide over the ZnO layer. A layer of photoresist is then spread over the silicon dioxide and photolithographically patterned to create windows in which the aluminum nitride is to be formed. The silicon dioxide is then etched, using a buffered hydrogen fluoride solution or a plasma etch technique. Following etching of the window in the silicon dioxide, the zinc oxide is then etched using citric acid. The double etching leaves a shelf of silicon dioxide over a cavity in the ZnO which exposes the aluminum below the zinc oxide layer.

Having thus opened windows over the aluminum in the areas in which the piezoelectric resonator material is to be deposited, the device is returned to the DC magnetron. Using a highly pure aluminum target (99.999% purity) in a nitrogen atmosphere, a very pure thin and smooth layer of aluminum nitride is deposited, approximately 2.5 microns in thickness.

After deposition of the aluminum nitride film, the wafer is then soaked in dilute citric acid which tends to dissolve the ZnO. That process is conventionally known as dielectric liftoff. In the present instance, the aluminum nitride in regions other than the window is removed, leaving the aluminum nitride thin film deposited over and in intimate contact with the aluminum in the region which had been defined by the window. The partially completed device at this stage is illustrated in FIG. 4b.

Figure 4C:
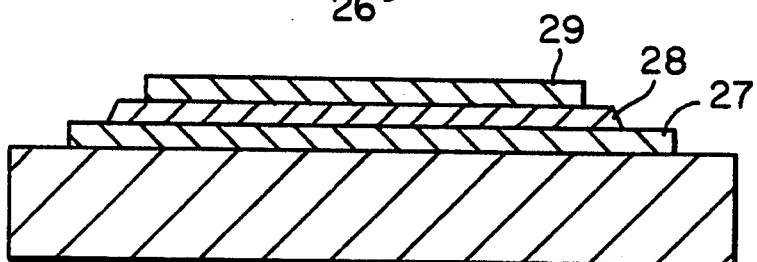
Figure 4D:
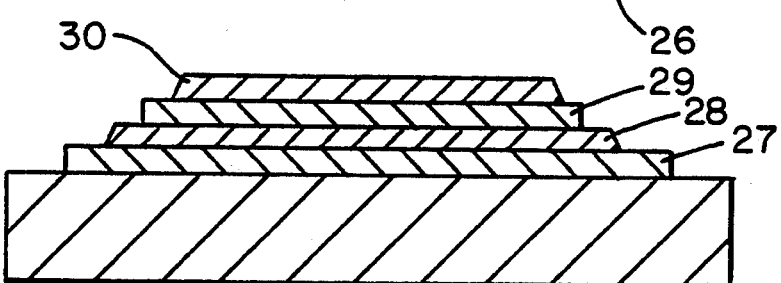
Figure 4E:
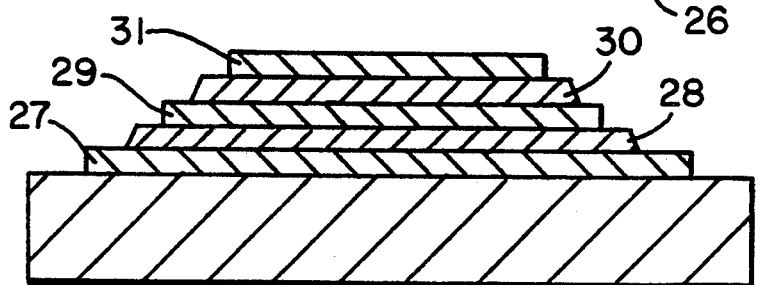

The device is then subjected to a further plating and photolithographic process for formation of an intermediate electrode 29. FIG. 4c shows the intermediate electrode 29 deposited over the aluminum nitride piezoelectric layer 28 and FIG. 4d shows the device after the formation of an additional piezoelectric layer 30, both layers being deposited by the processes previously described. FIG. 4e shows the device after the formation of the upper metallization 31.

The formation of the upper metallization layer 31 is preferably by a liftoff process. Having thus patterned and deposited the dielectric layer, the upper metallization is deposited by a suitable process such as electron beam evaporation. The wafer with deposited upper metallization is then soaked in a bath of acetone to dissolve the photoresist and lift off the metal in all but the desired areas. FIG. 4e illustrates the wafer at this stage and shows the thin film resonator.

Figure 4F:
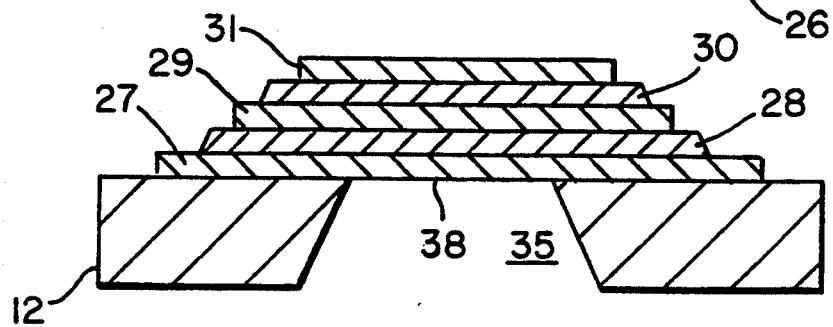

In accordance with the present invention, the thin film resonator requires a membrane in the area 26; that membrane is formed by subsequent process steps which selectively remove the silicon substrate but do not attack the thin film resonator. FIG. 4f illustrates the patterning of an aperture 35 on the second surface 14 of the substrate 12 and the etching of that aperture in the area 26. It is seen that the etching proceeds until the lower aluminum layer 27 is reached, with the aluminum layer 27 serving as an etchant stop to define a thin membrane 38 comprising the metallization layers and intermediate aluminum nitride film forming the resonating device of the thin film resonator. It will be appreciated by those skilled in the art that the drawings are not to scale, and that the individual layers 27–31 which make up the thin film resonator are on the order of only several microns in thickness, whereas the substrate 12 is substantially more than an order of magnitude thicker than the combined layers which form the resonator.

It can be seen that the process illustrated in FIGS. 4a–4f is not limited to the formation of thin film resonators, but can be employed for the formation of any electronic device on a silicon substrate which must be etched without damage to the electronic device. The process described above can be employed, for example, to produce a device such as that shown in FIG. 2. FIG. 2 shows an electronic device 45 deposited on the same substrate as a stacked crystal filter 25. The formation of the stacked crystal 25 filter requires the etching of the substrate 12. The process employed by the invention can be employed to fabricate the electronic device 45 on the substrate 12 with the stacked crystal filter 25 before the etching step. The etching required for completion of the stacked crystal filter 25 will not damage the electronic device 45. Further details of the etching process will be provided below (as well as additional detail on the sputtering of the piezoelectric film) to better illustrate the practice of the present invention.

As noted above, the aluminum nitride film is a highly oriented and very pure film formed by sputter deposition. In forming that film, it has been found desirable to utilize specialized techniques to account for the relatively long deposition times which are required. Those techniques involve utilization of a DC magnetron reactive sputtering system which in one implementation uses an 1800 watt, 600 volt DC power supply as the current source. Typical operating parameters are 3 mTorr pressure, 0.75 amp current with a voltage drop across the nitrogen plasma of about 350 volts. The semiconductor substrate is positioned opposite a very pure (99.999%) aluminum target. A ring positioned between the substrate and target acts as an anode to assist in containing and stabilizing the nitrogen plasma. The ring typically has a potential of about 60 volts. The plasma contains a large number of positively charged ions which accelerate into the target, knocking loose atoms of aluminum. The aluminum atoms then traverse the chamber and deposit on available surfaces. When being deposited in the presence of a reactive gas such as nitrogen, the aluminum atoms will form compounds, in the present instance aluminum nitride.

As noted above, the aluminum nitride films are preferably a total of about 5 microns in thickness in order to provide resonator response at about 1 GHz. At optimum deposition parameters, approximately 90 minutes of deposition are required. In addition, the crystal grain growth must be oriented in order to provide good piezoelectric response.

Using those relatively long deposition times, the chamber of the magnetron becomes electrically insulated, which can result in impurities being dislodged from the chamber and deposited in the aluminum nitride film forming on the semiconductor substrate.

As set forth in copending, commonly assigned U.S. patent application Ser. No. 07/813,101, filed Dec. 23, 1991, now U.S. Pat. No. 5,232,571, entitled "Aluminum Nitride Deposition Using A AlN/Al Sputter Cycle Technique", during the relatively lengthy deposition procedure, a layer of aluminum metal is periodically deposited over the aluminum nitride buildup on the chamber to prevent contamination of the AlN film being deposited on the semiconductor substrate. This is accomplished by changing the reactive gas in the chamber to argon in place of the nitrogen for a brief period. To prevent the wafer from being coated with the aluminum during this periodic "cleansing" process, a shutter is moved into place over the substrate to act as a shield. Thus, at periodic intervals, such as about 30 minutes, during the deposition of the aluminum nitride, the shutter is closed and the nitrogen atmosphere replaced with argon, to coat the walls and other elements of the reactor with an aluminum film. The argon is then removed and the nitrogen atmosphere returned, following which the shutter is opened and aluminum nitride deposition continued, until the required thickness has been built up. The alternating of AlN and Al deposition (with shutter closed during Al deposition) is repeated until the required amount of AlN has been deposited onto the semiconductor substrate. This procedure has been found to produce substantially purer films than has been available using conventional sputtering techniques.

In the process description of FIGS. 4a–4f, particular mention was made of the selective etching step for removing substrate material from below the membrane of the thin film resonator, and also the process step for dielectric liftoff in connection with patterning the dielectric layer of the thin film resonator. Additional information will now be given on those two process steps.

In removing substrate material from below the membrane of the thin film resonator, an anisotropic etching process is employed which etches along the (100) crystal axes but not along the (111) crystal axes from the rear surface 26, with the first metal layer 27 serving as an etchant stop. The rear surface 26 of the substrate is masked by suitable materials such as a silicon dioxide layer appropriately patterned using standard techniques to form windows in the areas where the membrane is to be formed. The windows can be aligned with the devices formed on the upper surface 13 as by using infrared alignment techniques.

The etching solution which has been found to be selective to silicon while substantially nonreactive to the aluminum nitride and aluminum metallization is an aqueous solution of hydrazine and quinoxaline preprocessed as will be described below. A desirable solution consists of proportions comprising approximately 850 milliliters of hydrazine hydrate (85 weight percent solution), 650 milliliters of deionized water, and approximately 1 gram of quinoxaline which has been vacuum distilled to remove oxide contamination. The quantity of quinoxaline present is insufficient to cause the quinoxaline to act as a chelating agent. The solution is heated to a reaction temperature of about 108° C., its boiling point.

In accordance with the present invention, the solution is then preprocessed to render it selective to silicon. Once the reactor is at temperature, preprocessing is commenced by immersing a silicon wafer for a short interval, approximately 5 minutes, for example. The immersion of the wafer introduces atomic silicon into the solution in a quantity sufficient to render the etchant selective to silicon. The wafer is then removed and the solution is allowed to precondition for a period, preferably at least 30 minutes. Although the length of the preconditioning is not critical, the preconditioning is necessary to render the solution selective to silicon. The length of the interval of preconditioning is not limited to 30 minutes, and indeed once a solution is employed etch integrated devices on silicon, the preconditioning indeed can extend in time for substantially beyond 30 minutes with the solution remaining selective to silicon.

Having preconditioned the etching solution by treatment with silicon and aging, wafers of the type illustrated in FIG. 4e are then immersed in the heated solution for etching. The solution is selective to silicon and thus will remove the silicon substrate in the area 26 defined by the windows while not attacking the metallization or dielectric layers on the upper surface of the device. In some cases, it may be desirable to passivate the upper surface of the wafer with a material such as silicon dioxide which is not reactive to the etchant. When etching is completed, as will be determined when the etching reaches the aluminum layer 27 to which the etchant is nonreactive, thus serving as an etchant stop, the wafer is then removed from the etchant solution, rinsed with deionized water and dried, such as in a stream of nitrogen gas.

The significance of the foregoing etchant process will be appreciated in that it provides a mechanism for allowing formation of both the semiconductor device and the thin film resonator on wafers which can be readily handled in the ordinary semiconductor fabrication process flow, followed by a subsequent etching step for formation of the thin film resonator membrane by a selective etching process which removes the silicon to form the membrane without attacking the elements previously put in place which make up the devices. Indeed, since the materials of the resonator are nonreactive to the etchant, they can be exposed to the etchant for a long enough time to assure that all undesired materials are removed (about 3–4 hours). This aspect of the invention substantially lessens the time and temperature criticality of the etching process.

The process steps involved in the formation of the thin film resonator are adapted for forming high quality resonators and freeing the membrane for vibration, without the need for the creation of a p+ layer, and allowing the exposure of the device to the etchant without danger of damage to the device.

Moreover, the invention has broader applications than the production of thin film resonators. The process steps employed by the invention can be used to fabricate any electronic device requiring the deposition of a patterned aluminum layer on a silicon substrate and the subsequent etching of the substrate. The invention allows the etching to proceed without any danger of damage to the device, or any need to take steps to protect the device from damage by the etchant.

What is claimed is:

1. A process for selectively etching silicon comprising the steps of:
    preparing a solution of etchant which is a non-selective etch for at least silicon and aluminum;
    preconditioning the prepared solution by adding atomic silicon to the solution and aging the solution after the addition of silicon for at least 30 minutes; and
    immersing silicon substrates carrying aluminum in the preconditioned solution to etch the silicon while leaving the aluminum substantially unetched.

2. The process as set forth in claim 1, wherein the etchant comprises an aqueous solution of hydrazine and quinoxaline.

3. The process as set forth in claim 2, wherein the preconditioning of the solution includes inserting a sample of silicon in the solution for at least five minutes and aging the solution after removal of the sample of silicon for at least 30 minutes.

4. A process for fabricating an electronic device on a silicon substrate, the device having a patterned conductor and an etched aperture in the substrate, the process comprising the steps of:
    providing a silicon substrate;
    forming the electronic device on the substrate, the forming step including the step of depositing and patterning at least one aluminum pattern, at least part of the aluminum pattern being exposed to an etchant solution and serving as an etchant stop;
    providing the etchant solution comprising an aqueous solution of hydrazine and quinoxaline, and preconditioning the etchant solution by treating the solution with silicon and aging the treated solution, thereby rendering the preconditioned etchant solution selective to silicon; and utilizing the etchant solution to etch an aperture in the silicon substrate to remove an area of the substrate without removal of the exposed aluminum pattern.

5. The process as set forth in claim 4, wherein the preconditioning of the solution includes inserting a wafer of silicon in the solution for at least five minutes and aging the solution after removal of the wafer for at least 30 minutes.

6. A process for fabricating a thin film resonator comprising the steps of:

providing a silicon substrate having first and second surfaces;

depositing alternating metallization layers and piezoelectric layers on the first surface of the substrate, with the metallization layers being the first and last deposited layers;

etching an aperture in the second surface of the silicon substrate to remove an area of the substrate from below the resonating portion of the thin film resonator, the step of etching comprising immersing the substrate in a selective etchant solution comprising an aqueous solution of hydrazine and quinoxaline, and preconditioning the etchant solution by inserting a sample of silicon in the solution for at least five minutes and aging the solution after removal of the sample of silicon for at least 30 minutes, thereby rendering the preconditioned etchant solution selective to silicon in the presence of the metallization or piezoelectric material of the resonator; and terminating the etching step when the etching reaches the first deposited layer.

7. The process as set forth in claim 6, wherein the metallization layers are aluminum and the piezoelectric layers are aluminum nitride.

8. The process as set forth in claim 6, wherein the layers are deposited by DC sputtering.

9. The process as set forth in claim 8, wherein the layers are about 5 microns thick.

10. The process as set forth in claim 6 wherein the last deposited layer is deposited by a dielectric liftoff process.

11. A process for fabricating a thin film stacked crystal filter, comprising the steps of:

providing a planar silicon substrate with generally planar opposed first and second surfaces;

employing DC sputtering to deposit on the first surface of the substrate three aluminum electrode layers and two aluminum nitride piezoelectric layers, the layers being deposited in alternation, with the first, third, and fifth layers being aluminum and the second and fourth layers being aluminum nitride;

etching a via in the second surface of the silicon substrate to remove an area of the substrate from below the resonating portion of the stacked crystal filter, the step of etching comprising immersing the substrate in a selective etchant which is selective to silicon in the presence of the metallization or piezoelectric material of the resonators; and terminating the etching when the etching reaches the first deposited layer.

12. The process as set forth in claim 11, wherein the etchant is preconditioned by inserting a sample of silicon in the etchant for at least 30 minutes and aging the solution etchant after removal of the sample of silicon for at least three hours.

13. The process as set forth in claim 12, wherein the piezoelectric layers are each about 2.5 microns thick.

14. The process set forth in claim 11 wherein the etching step comprises immersing the substrate in an etching solution comprising an aqueous solution of hydrazine and quinoxaline.

15. The process as set forth in claim 14 wherein the etching solution is preconditioned by the addition of atomic silicon followed by aging for at least 30 minutes.

* * * * *

UNITED STATES PATENT AND TRADEMARK OFFICE
CERTIFICATE OF CORRECTION

PATENT NO. : 5,348,617
DATED : September 20, 1994
INVENTOR(S) : Steve D. Braymen It is certified that error appears in the above-identified patent and that said Letters Patent is hereby corrected as shown below:

Column 1, line 3, insert the following paragraph:

-- GRANT REFERENCE

This invention was made with Government support under Contract No. ITA 87-02 awarded by U.S. Department of Commerce. The Government has certain rights in the invention. --

Signed and Sealed this

Tenth Day of January, 1995

*Attest:*

BRUCE LEHMAN

*Attesting Officer*    Commissioner of Patents and Trademarks